United States Patent [19]

Fikart

[11] 4,121,163
[45] Oct. 17, 1978

[54] LOW-NOISE MICROWAVE SIGNAL GENERATOR

[75] Inventor: Josef L. Fikart, Port Coquitlam, Canada

[73] Assignee: GTE Lenkurt Electric (Canada) Ltd., Burnaby, Canada

[21] Appl. No.: 812,544

[22] Filed: Jul. 5, 1977

[51] Int. Cl.² ............................................ H03B 19/00
[52] U.S. Cl. ..................................... 328/16; 328/167; 330/56; 331/77; 333/70 R
[58] Field of Search ................... 328/16, 167, 20, 160; 330/56; 331/77; 333/70 R

[56] References Cited

U.S. PATENT DOCUMENTS

| 3,231,828 | 1/1966 | Craft | 328/16 X |
| 3,628,163 | 12/1971 | Heibel | 328/167 |
| 4,011,466 | 3/1977 | Pearlman et al. | 328/167 X |

OTHER PUBLICATIONS

The Radio Amateur's Handbook, copyright 1971, Fig. 17-7, p. 436, 48th Ed.

Primary Examiner—John S. Heyman
Attorney, Agent, or Firm—Douglas M. Gilbert

[57] ABSTRACT

A microwave signal generator having improved noise spectral characteristics employs a plurality of amplifier-frequency multiplier circuits in combination with a very stable VHF oscillator. Instead of lumping the amplification and frequency multiplication together, each in a single stage, a plurality of amplifiers and multipliers are interleaved, as described herein, resulting in reduced FM noise generation.

6 Claims, 2 Drawing Figures

LOW-NOISE MICROWAVE SIGNAL GENERATOR

BACKGROUND OF THE INVENTION

1. Field of the Invention

In microwave FM (frequency modulation) communication systems capable of handling frequency division multiplex telephone channels or video signals, the noise generated by local oscillators is always an important system consideration. To satisfy the overall noise performance requirements, in a multihop microwave system the local oscillators must meet relatively stringent noise limits. For example, the FM noise of a single local oscillator in the baseband frequency range 70 kHz - 4MHz typically should be more than 83 dB below the standard 200 kHz rms FM deviation. Such noise requirements as this dictate the use of particular types of oscillator designs and preclude the use of others.

2. Description of the Prior Art

A number of different microwave signal generators suitable for use as local oscillators have been designed for good short-term stability and low FM noise generation. A survey of such oscillators and the problems encountered with these designs is found in a article entitled, "Short Term Stable Microwave Sources", by D. B. Leeson, in *The Microwave Journal,* June 1970.

One of the most common type of microwave local oscillator is known as the crystal-multiplier microwave source. A quartz crystal, placed in a VHF oscillator, is usually used as the basic frequency reference element. Frequency multipliers, usually using varactors or step recovery diodes, increase the frequency of the VHF crystal oscillator to the desired microwave frequency. Amplifiers are also used in the oscillator-multiplier chain to overcome the high power losses of the multipliers. A bandpass filter selects the desired frequency component and suppresses the unwanted harmonics. Incidental to this design is a microwave isolator which matches the multiplier to the filter, and thereby reduces reflections back into the multiplier stage.

Although this design is seemingly simple, the actual circuit can be quite complex. Furthermore, FM noise is often a problem in this design because of the high level of amplification needed to drive the multiplier circuits. Typically, a class C amplifier design is used which produces AM and PM signal distortion and shot noise. And when this noise is applied to the frequency multiplier, the noise frequency deviation is amplified by frequency multiplier factor. Consequently, a noise stripping filter is commonly used at the amplifier output to reduce the FM noise. Such filters add to the oscillator cost, and they have their own design deficiencies, such as frequency stability. Furthermore, power dissipation in this design is high whether the amplifier is a class A or a class C type design. High power dissipation naturally leads to heat dissipation problems.

OBJECTS AND SUMMARY OF THE INVENTION

It is an object of this invention to provide an improved microwave frequency signal generator for use in an FM microwave system.

It is further object of this invention to provide an improved microwave frequency generator which is inexpensive, has low DC power dissipation, and has good FM noise performance.

In accordance with the above objects, there is provided a novel design employing distributed amplifier/-multiplier stages. A frequency stable VHF oscillator, usually crystal controlled, provides a low-noise reference signal having a frequency $f_x$. At least two amplifier/multiplier stages generate a composite signal having at least N frequency components harmonically related to $f_x$. A microwave bandpass filter centered about the frequency $Nf_x$ and adapted to receive the composite signal, selects the desired low-noise microwave signal having a frequency $Nf_x$.

DETAILED DESCRIPTION OF THE PREFERRED EMBODIMENT

Figure 2:
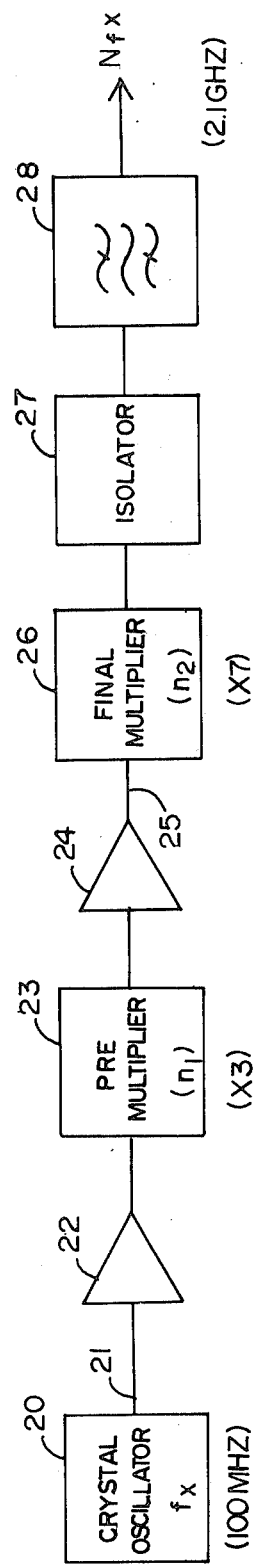
FIG. 2 is a block diagram of an improved microwave signal generator employing the features of this invention.

Referring to FIG. 2, oscillator 20 is shown as a crystal oscillator which generates the stable low-noise VHF signal on path 21. Crystal oscillators are commonly used for this purpose since they are efficient in terms of cost, size, power consumption, noise performanmce, and long-term frequency stability. The VHF signal (shown as 100 MHz) is amplified by a small-signal amplifier 22. This buffer amplifier 22 serves to isolate crystal oscillator 20 from the premultiplier 23, i.e., it provides both the oscillator and the multiplier with a good impedance match to prevent reflections and the resulting instability. Buffer amplifier 22 also provides signal gain which is needed to compensate for the premultiplier conversion loss. The gain of buffer amplifier 22 is normally set relatively high but without causing any problems of instability between crystal oscillator 20 and premultiplier 23. Too high a gain could result in just such an instability.

Instead of amplifying the signal level to a high power point, as is done in the prior art, the VHF signal is applied to a frequency premultiplier 23. The decision of how to split the total frequency multiplication into two or more independent stages depends upon several factors, and each application must be handled on a case by case basis. However, the frequency premultiplier should be at least a x3 multiplier. The maximum amount of multiplication depends upon the particular frequencies involved. In general, too much increase in frequency will necessitate a more complex medium power amplifier design. The frequency should be kept low enough so that signal gain does not become serious design problem. e.g., A power amplifier at 300 MHz is more desirable than a 1 GHz amplifier. On the low end, too low a multiplication factor will necessitate the medium power amplifier 24 to generate too high a level before final multiplication in the multiplier 26. The optimum design depends upon particularly the frequencies involved, the circuit losses, and the total multiplication factor required.

Premultiplier 23, as is true with most multiplier circuit designs, utilizes a small amount of filtering on both the input and output connections. The filtering on the output is particularly desirable since high level undesirable frequency components could possibly overload the medium power amplifier. The filtering in the premultiplier prevents this by suppressing the unwanted frequency harmonics. This output signal of frequency $n_1 f_x$ is amplified in the medium power amplifier 24 and applied to the final multiplier circuit 26 where the desired microwave signal is finally generated. As in FIG. 1 the microwave frequency signal is applied to an isolator 27 and a narrow bandpass filter 28. There are particular multiplier designs which would not require such an isolator circuit, however, most multiplier designs have a broad frequency spectral output and do require some form of isolation with a bandpass filter. A broadband output would have undesirable harmonics which, depending upon the termination of the filter, could be reflected back into the multiplier resulting in an instability. Clearly the situation is a return loss problem rather than an inherent requirement of the system. The bandpass filter 28 is a microwave type filter which selects the desired harmonic from the multiplier ouput.

Figure 1:
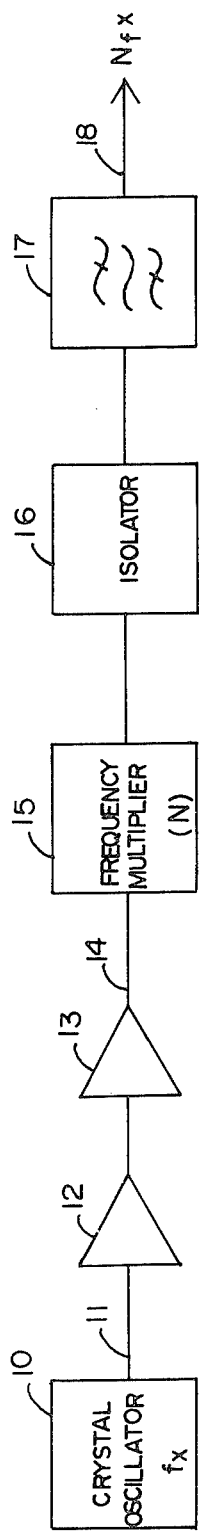
FIG. 1 is a block diagram of a microwave signal generator used in the prior art which has been heretofor described.

The "lumped approach" as explained in relation to FIG. 1, above, has inherently high FM noise due principally to the high noise generated at the output of the high power amplifier 13. This noise is then multiplied in power by the multiplier factor of frequency multiplier 15. It can be shown that the distributed approach of FIG. 2, has superior noise performance in theory and in practice, all other factors being the same. To understand why this is true the two designs should be compared. It is assumed that the gains and losses of the lumped and distributed designs are the same i.e., the level of $f_x$ is the same at 11 and at 21 and the level of $Nf_x$ is the same at 18 and 29. It can be assumed that both buffer amplifiers 22 and 12 contribute little to the overall FM noise. The premultiplier 23 (shown as a tripler in FIG. 22) also contributes relatively little noise to the desired signal. The output power level required of the medium power amplifier 24 is less than the output power level required of the power amplifier 13. Because the output power level of amplifier 24 is kept relatively low, the FM noise contributed by this amplifier is much less than the noise from the high power amplifier 13. And, more importantly, the FM noise which is generated is then multiplied by a smaller factor, (3 times less using the numbers of the example of FIG. 2) which further lower the FM noise. Consequently, the noise generated by the distributed approach is significantly lower than the noise generated by the lumped approach circuit.

What is claimed is:

1. Apparatus for producing a low-noise frequency-stable microwave signal comprising:
    a low-noise frequency-stable VHF signal generator providing a first signal having a frequency $f_x$;
    first amplifier means having a first amplifier input and a first amplifier output, said first amplifier input connected to said signal generator, and providing signal gain in the VHF range to said first signal;
    first frequency multiplier means having a first multiplier input and a first multiplier output, said first multiplier input connected to said first amplifier output, said multiplier means generating a second signal harmonically related to $f_x$;
    second amplifier means having a second amplifier input and a second amplifier output, said second amplifier input connected to said first multiplier output, and providing signal gain to said second signal;
    second frequency multiplier means having a second multiplier input and a second multiplier output, said second multiplier input connected to said second amplifier output, said second multiplier means generating a signal of frequency $Nf_x$, where N is a predetermined integer and $Nf_x$ is in the microwave frequency range; and
    a microwave bandpass filter connected to said second multiplier output, having a passband centered about $Nf_x$, and producing a microwave frequency signal having a total noise content less than what would be produced by an otherwise equivalent amplifier-frequency-multiplier combination interconnected between said VHF signal generator and said microwave bandpass filter.

2. Apparatus as in claim 1 further comprising a microwave isolator having an input and output, said isolator input connected to said second multiplier output and said isolator output connected to said microwave bandpass filter.

3. Apparatus as in claim 2 wherein said stable signal generator further comprises a quartz crystal controlled oscillator.

4. Apparatus as in claim 3 wherein said first frequency multiplier means further comprises a frequency premultiplier having at least a times three multiplication factor.

5. Apparatus as in claim 4 wherein said second frequency multiplier means further comprises a frequency multiplier having at least a times three multiplication factor.

6. Apparatus as in claim 5 wherein said first amplifier means further comprises an amplifier having a signal gain no greater than 10 dB.

* * * * *